(12) United States Patent
Nitta

(10) Patent No.: US 7,407,739 B2
(45) Date of Patent: Aug. 5, 2008

(54) RESIST DEVELOPER AND RESIST PATTERN FORMATION METHOD USING SAME

(75) Inventor: Kazuyuki Nitta, Kawasaki (JP)

(73) Assignee: Tokyo Ohka Kogyo Co., Ltd., Tokyo (JP)

( * ) Notice: Subject to any disclaimer, the term of this patent is extended or adjusted under 35 U.S.C. 154(b) by 0 days.

(21) Appl. No.: 11/239,781

(22) Filed: Sep. 29, 2005

(65) Prior Publication Data

US 2006/0029885 A1 Feb. 9, 2006

Related U.S. Application Data

(62) Division of application No. 10/422,548, filed on Apr. 24, 2003, now abandoned.

(30) Foreign Application Priority Data

Apr. 26, 2002 (JP) .............................. 2002-127279

(51) Int. Cl.
G03F 7/32 (2006.01)

(52) U.S. Cl. .................. 430/322; 430/325; 430/326; 430/327; 430/331

(58) Field of Classification Search ................ 430/311, 430/322, 325, 326, 327
See application file for complete search history.

(56) References Cited

U.S. PATENT DOCUMENTS

| | | | |
|---|---|---|---|
| 4,141,733 A | 2/1979 | Guild | |
| 4,299,684 A | 11/1981 | Liotta | |
| 4,776,929 A | 10/1988 | Aoyama et al. | |
| 5,558,976 A * | 9/1996 | Urano et al. ................. | 430/326 |
| 5,852,128 A * | 12/1998 | Padmanaban et al. .... | 525/328.8 |
| 5,879,851 A | 3/1999 | Takahashi et al. | |
| 5,985,512 A * | 11/1999 | Hatakeyama et al. .... | 430/270.1 |
| 6,451,510 B1 | 9/2002 | Messick et al. | |
| 6,527,966 B1 | 3/2003 | Shimomura et al. | |
| 6,599,683 B1 | 7/2003 | Torek et al. | |
| 6,602,654 B2 * | 8/2003 | Iwata et al. ................. | 430/325 |

FOREIGN PATENT DOCUMENTS

| | | |
|---|---|---|
| JP | 61232453 | 10/1986 |
| JP | 61232454 | 10/1986 |
| JP | 01129250 | 5/1989 |
| JP | 04204454 | 7/1992 |
| JP | 06067439 | 3/1994 |
| JP | 2000187336 | 7/2000 |
| JP | 2000187337 | 7/2000 |

* cited by examiner

*Primary Examiner*—Hoa V Le
(74) *Attorney, Agent, or Firm*—Knobbe, Martens, Olson & Bear LLP

(57) ABSTRACT

A resist developer capable of forming a high resolution resist pattern with good shape and little film thinning is provided, together with a resist pattern formation method using such a developer. The resist developer is an aqueous solution comprising an ammonium hydroxide represented by a general formula (I): $R^1_n R^2_{4-n} N^+ \cdot OH^-$ wherein $R^1$ is a lower alkyl group in which the number of carbon atoms is A, $R^2$ is a lower alkyl group in which the number of carbon atoms is B, A<B, and n is an integer from 1 to 3.

9 Claims, No Drawings

RESIST DEVELOPER AND RESIST PATTERN FORMATION METHOD USING SAME

CROSS REFERENCE TO RELATED APPLICATION

This is a divisional application claiming the benefit of prior-filed U.S. patent application Ser. No. 10/422,548, filed Apr. 24, 2003, now abandoned entitled "RESIST DEVELOPER AND RESIST PATTERN FORMATION METHOD USING SAME," which claims the priority of JP Application No. 2002-127279, filed Apr. 26, 2002.

BACKGROUND OF THE INVENTION

1. Field of the Invention

The present invention relates to a developer for a resist, and a resist pattern formation method using such a developer.

2. Description of the Related Art

In conventional production processes for semiconductor elements or liquid crystal elements, a lithography process is conducted to form a pattern on the substrate being processed. During this lithography process, a thin film of a photosensitive material known as a resist is applied evenly across the surface of the substrate to form a resist film (resist layer), and this film is then exposed through a mask pattern, and subsequently developed to form a resist pattern.

Resists are materials which display a change in solubility as a result of cross linking reactions or bond breaking which occur on irradiation with light or a variety of other beams, and perform two roles, namely, the formation of a real image of pattern information (exposure through to the development process), and as a mask for the processing of another layer (an etching process).

Resists include both positive resists and negative resists. During the development process, the exposed portions of a positive resist dissolve in the developer, whereas the unexposed portions remain undissolved. In contrast, in a negative resist, the unexposed portions dissolve in the developer, and the exposed portions remain.

The fineness of the pattern that can be formed is proportional to the wavelength of the light source used in the exposure. Accordingly, in order to further miniaturize resist patterns, the light sources used must be shifted to shorter wavelengths. As a result, in recent years there has been a shift away from the conventional i-line radiation (exposure wavelength 365 nm), and KrF excimer lasers (248 nm) are becoming more widely used. In addition, development of the next generation light sources, including ArF excimer lasers (193 nm) and $F_2$ excimer lasers (157 nm) is also proceeding rapidly.

Resists for use with these excimer lasers are known as chemically amplified resists, and typically comprise a homogenous solution of a base resin and an acid generator dissolved in an organic solvent.

Chemically amplified resists utilize acid catalysis, and incorporate an acid generator which generates acid on exposure, and a base resin with a high reactivity to acid (and in the case of a negative resist, an additional cross linking agent).

The reaction of a chemically amplified resist is described using a positive resist as an example. First, when the positive resist is exposed, the acid generator becomes excited and emits a proton. Subsequently, by performing heat treatment by PEB (Post Exposure Baking), these protons attack the protective groups (acid dissociable, dissolution inhibiting groups) of the base resin, and these protective groups are eliminated, causing the base resin to become soluble in an alkali developer.

Conventionally, alkali aqueous solutions are widely used as developers for resists. However, if an alkali aqueous solution containing metal ions is used as a developer, then problems can occur in the characteristics of the semiconductor element or liquid crystal element, and as a result, developers containing an organic alkali such as tetramethylammonium hydroxide (TMAH) dissolved in water are typically used in preference to inorganic alkalis such as sodium (hydrogen) carbonate, potassium (hydrogen) carbonate or sodium hydroxide.

TMAH has considerable advantages in that it is cheap, and very reliable in terms of its effect on elements, although developers containing TMAH or the like do suffer from problems, such as reductions in resolution and film thinning, resulting from the developer penetrating into the unexposed portions of the resist.

In addition, in recent years, with the move towards even more finely detailed resist patterns, a resist developer capable of improving the resolution and shape of the resist pattern has been keenly sought.

SUMMARY OF THE INVENTION

The present invention takes the above circumstances into consideration, with an object of providing a resist developer capable of forming a high resolution resist pattern with good shape and little film thinning, as well as a resist pattern formation method using such a developer.

As a result of intensive investigation, the inventors of the present invention discovered that a resist developer formed from an aqueous solution comprising an ammonium hydroxide represented by a general formula (I) shown below was able to achieve the aforementioned object, and were hence able to complete the present invention.

$$R^1{}_n R^2{}_{4-n} N^+ . OH^- \qquad (I)$$

(wherein, $R^1$ is a lower alkyl group in which the number of carbon atoms is A, $R^2$ is a lower alkyl group in which the number of carbon atoms is B, A<B, and n is an integer from 1 to 3)

In the above general formula (I), n is preferably 3.

The concentration of the aforementioned ammonium hydroxide within the aqueous solution is preferably within a range from 1 to 5 mass %.

In the above general formula (I), $R^1$ is preferably a methyl group and $R^2$ is preferably an ethyl group.

Furthermore, the present invention also provides a resist pattern formation method wherein following exposure of a resist layer provided on a substrate, development is conducted using the resist developer described above.

The resist layer is preferably formed from a chemically amplified positive resist.

The resist layer is preferably a layer formed using at least one of prebaking at 80° C. to 100° C., and post exposure baking (PEB) at 80° C. to 120° C.

The chemically amplified positive resist preferably comprises a resin with chain type alkoxyalkyl groups as acid dissociable, dissolution inhibiting groups as the base resin, and a bis-sulfonyl diazomethane as an acid generator.

The aforementioned acid generator is preferably a bis-alkylsulfonyl diazomethane.

By using a resist developer of the present invention, a resist pattern with a high resolution, little film thinning, a high degree of resist pattern perpendicularity, and a wide depth of focus can be formed. Accordingly, a resist developer of the present invention enables the formation of even more finely detailed resist patterns.

DETAILED DESCRIPTION OF THE PREFERRED EMBODIMENTS

As follows is a more detailed description of the present invention.

A resist developer of the present invention uses an ammonium hydroxide represented by a general formula (I) as a primary constituent.

$$R^1_n R^2_{4-n} N^+ . OH^- \quad (I)$$

Specific examples of $R^1$ and $R^2$ include lower alkyl groups of 1 to 5 carbon atoms such as methyl groups, ethyl groups, propyl groups, butyl groups and pentyl groups. $R^1$ and $R^2$ are different alkyl groups, and $R^2$ is a higher order alkyl group than $R^1$. Preferably, $R^1$ is a methyl group and $R^2$ is an ethyl group.

Furthermore, in the above formula, n is an integer from 1 to 3. Compounds in which n is 3 are easily obtainable, and are consequently preferred from an industrial point of view.

Specific examples of the ammonium hydroxide represented by the general formula (I) include trimethylmonoethylammonium hydroxide, dimethyldiethylammonium hydroxide, monomethyltriethylammonium hydroxide, trimethylmonopropylammonium hydroxide and trimethylmonobutylammonium hydroxide. These ammonium hydroxides may be used singularly, or in combinations of two or more different compounds.

A resist developer of the present invention is an aqueous solution comprising the above type of ammonium hydroxide.

There are no particular restrictions on the concentration of the ammonium hydroxide within the aqueous solution, provided it is consistent with the concentration levels typically used within developers for electronic devices. The concentration will also depend on the type of resist used, although typically values from 1 to 5 mass % are preferred. At concentration levels below 1 mass %, development becomes difficult, whereas at concentration levels exceeding 5 mass %, film thinning tends to increase. Particularly in cases in which the developer is used in the formation of a finely detailed resist pattern of no more than 0.2 μm on a semiconductor element, differences in the developer concentration have a large effect on the characteristics of the resist, and consequently a concentration level within a range from 2 to 3.5 mass % is preferred.

Furthermore, if a high concentration solution of concentration 10 to 25 mass % is prepared, then the solution can be easily transported to the factory or site of the production of the semiconductor elements or the like, and this solution can then be diluted prior to use as a developer.

In addition to the ammonium hydroxide described above, a resist developer of the present invention may, if needed, also comprise other additives typically used in conventional resist developers such as wetting agents, stabilizers, dissolution enhancers and surfactants. These additives may be added singularly, or in combinations of two or more additives.

Unlike the situation in conventionally used developers such as TMAH, in which the alkyl groups bonded to the nitrogen atom are all of the same type, in a resist developer of the present invention, it is important that the molecular structure incorporates at least one lower alkyl group which is of a higher order than the other lower alkyl groups.

The specific reasons for this requirement remain unclear, although it is surmised that the bonding of the higher order lower alkyl group to the nitrogen atom causes steric hindrance, weakening the penetration of the developer into unexposed portions of the resist, and thereby ensuring a high resolution and a reduction in film thinning.

In the present invention, a resist pattern can be formed by combining a resist developer as described above with any arbitrary resist. The resist pattern formation method can utilize conventional methods.

In a resist pattern formation method of the present invention, first for example, a resist is applied to a substrate such as a silicon wafer or a sheet of glass, either directly, or indirectly with an intermediate layer such as an antireflective film or a metallic film disposed therebetween, using normal application methods and a spinner, for example. The formation of the resist layer is then completed by performing a drying treatment (prebake). If an antireflective film is disposed between the substrate and the resist, then a high resolution resist pattern can be obtained, which is preferred.

Next, the formed resist layer is exposed, through a mask pattern, using a reduction projection exposure apparatus with a light source such as a KrF excimer laser. Subsequently, another heat treatment (PEB) is performed if required. The resist layer is then developed using an aforementioned resist developer. Post baking may also be performed after development.

There are no particular restrictions on the types of resist that can be used with a resist developer of the present invention, provided that the resist is soluble in an alkali developer. Both positive and negative resists can be used, although chemically amplified resists are preferred. The reason for this preference is that chemically amplified resists enable the formation of finely detailed resist patterns, and as the pattern becomes more finely detailed, the reduction of film thinning increases in importance.

A chemically amplified resist suitable for use with a resist developer of the present invention can be selected from known resists in accordance with the light source used for the exposure. Examples of these chemically amplified resists include positive or negative resists for use with a KrF excimer laser, positive or negative resists for use with an ArF excimer laser, positive resists for use with a $F_2$ excimer laser, and resists for use with electron beams or X-rays. Utilizing the fact that at least one of the alkyl groups of a resist developer of the present invention is a comparatively high order alkyl group, the resist developers of the present invention are particularly effective for resist layers in which the residual solvent quantity within the resist layer formed on a substrate is high, namely, resist layers formed using a prebake temperature of no more than 100° C. and/or a post exposure baking temperature of no more than 120° C., which have a low film density and are relatively susceptible to penetration by the developer. For these types of resist layers, the high resolution and film thinning reduction effects of a resist developer of the present invention are particularly pronounced.

The base resins of positive resists for use with a KrF excimer laser can be classified into two categories based on the type of protective groups (acid dissociable, dissolution inhibiting groups) within the resin.

One category comprises base resins with a tertiary alkyl (meth)acrylate unit such as tert-butyl(meth)acrylate, and a hydroxystyrene and/or a styrene unit (hereafter referred to as "type 1 base resins").

The other category comprises base resins based on polyhydroxystyrenes, in which a portion of the hydroxyl groups are substituted with chain type alkoxyalkyl groups such as ethoxyethyl groups, and may also be substituted with tertiary alkoxycarbonyl groups such as tert-butoxycarbonyl groups, or cyclic ether groups such as tetrahydropyranyl groups (hereafter referred to as "type 2 base resins").

In acrylate units or hydroxystyrene units substituted with an acid dissociable, dissolution inhibiting group such as a tertiary alkyl group or a chain type alkoxyalkyl group, the action of the acid generated from the acid generator causes an elimination of the acid dissociable, dissolution inhibiting group within the exposed portions. For example, in a hydroxystyrene unit in which the hydrogen atom of the hydroxyl group has been substituted with one of the above types of groups, the acid dissociable, dissolution inhibiting group is eliminated, resulting in a conversion to a phenolic hydroxyl group. In a similar manner, an acrylate unit is converted to a carboxyl group. In this manner, a resin which was insoluble in alkali prior to exposure becomes alkali soluble following exposure.

In addition to the structural units described above, the above base resins can also comprise structural units derived from known monomers used in chemically amplified positive resists for use with a KrF excimer laser, such as hydroxystyrene derivatives, as well as acrylic acid and methacrylic acid derivatives, provided the inclusion of these structural units does not impair the effects of the present invention.

There are no particular restrictions on the acid generator combined with the base resin described above, and a suitable acid generator can be selected from amongst the known acid generators, including diazomethanes, nitrobenzyl derivatives, sulfonate esters, onium salts, benzoin tosylates, halogenated triazine compounds, cyano group containing oxime sulfonate compounds, as well as derivatives of the above compounds.

Specific examples include bis-sulfonyl diazomethanes such as bis(p-toluenesulfonyl)diazomethane, bis(1,1-dimethylethylsulfonyl)diazomethane, bis(2,4-dimethylphenylsulfonyl)diazomethane, bis(1-methylethylsulfonyl)diazomethane and bis(cyclohexylsulfonyl)diazomethane; and onium salts such as bis(4-tert-butylphenyl)iodonium trifluoromethanesulfonate or nonafluorobutanesulfonate, triphenylsulfonium trifluoromethanesulfonate or nonafluorobutanesulfonate, and diphenyliodonium trifluoromethanesulfonate or nonafluorobutanesulfonate. Onium salts are particularly preferred for type 1 base resins, and bis-sulfonyl diazomethanes are preferred for type 2 base resins, with bis-alkylsulfonyl diazomethanes being particularly preferred. The alkyl group in these bis-alkylsulfonyl diazomethanes is preferably a straight chain, branched chain or cyclic alkyl group of 3 to 7 carbon atoms, and methyl groups, butyl groups and cyclohexyl groups are particularly preferred. Bis(cyclohexylsulfonyl) diazomethane is particularly desirable. These acid generators may be used singularly, or in combinations of two or more compounds.

The quantity of the acid generator used is typically within a range from 0.5 to 30 parts by mass, and preferably from 1 to 10 parts by mass, per 100 parts by mass of the base resin. If the quantity of the acid generator is less than 0.5 parts by mass, then pattern formation does not occur satisfactorily, whereas if the quantity exceeds 30 parts by mass, obtaining a homogenous solution becomes difficult, and the storage stability may deteriorate.

Examples of preferred chemically amplified positive resists used in the present invention which can be used with a KrF excimer laser include resins with chain type alkoxyalkyl groups as acid dissociable, dissolution inhibiting groups, as the base resin, and a bis-sulfonyl diazomethane as the acid generator. Using this type of resist, a resist layer (film) can be formed via heat treatment including prebaking at no more than 100° C. (80° C. to 100° C.), and PEB at no more than 120° C. (80° C. to 120° C.). As described above, because the residual solvent quantity within such a resist film is high, and the film density when forming a resist layer on a substrate is low, conventional developers would penetrate into the unexposed portions, causing a deterioration in resolution and pattern shape, and also causing an increase in film thinning. However, a resist developer of the present invention is less likely to penetrate into the unexposed portions of this type of resist, meaning the resolution is high, film thinning of the unexposed portions is reduced, and the effects of the present invention are considerable.

On the other hand, base resins for positive resists for use with an ArF excimer laser are preferably non-aromatic resins with polycyclic hydrocarbon groups on the principal chain or on side chains. Suitable examples include resins with acid dissociable groups but with no aromatic groups, including resins with polycyclic groups such as norbornene on the principal chain, or acrylate or methacrylate resins with polycyclic hydrocarbon groups such as adamantane at the ester section.

In addition to the structural units described above, the above base resins can also comprise structural units derived from known monomers used in chemically amplified positive resists for use with an ArF excimer laser, such as hydroxystyrene derivatives, as well as acrylic acid and methacrylic acid derivatives, provided the inclusion of these structural units does not impair the effects of the present invention.

There are no particular restrictions on the acid generator combined with the base resin described above, and a suitable acid generator can be selected and used from amongst known acid generators. Specific examples include onium salts such as diphenyliodonium trifluoromethanephosphate, diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (p-tert-butylphenyl) diphenylsulfonium trifluoromethanesulfonate, diphenyliodonium nonafluorobutanesulfonate, bis(p-tert-butylphenyl) iodonium nonafluorobutanesulfonate, and triphenylsulfonium nonafluorobutanesulfonate. Of these, onium salts with a fluorinated alkylsulfonate ion as the anion are preferred. These acid generators may be used singularly, or in combinations of two or more compounds.

The quantity of the acid generator used is similar to that described for the case of a positive resist for use with a KrF excimer laser. In the case of ArF resists, provided a resist layer is formed via prebaking at no more than 100° C. (80° C. to 100° C.), and PEB at no more than 120° C. (80° C. to 120° C.), the effects of a developer of the present invention can be favorably exhibited.

A chemically amplified resist is used as a solution, which is formed by dissolving a base resin and an acid generator, such as those described above, together with other additives where required, in an organic solvent. The organic solvent may be any solvent capable of dissolving both the base resin and the acid generator to form a homogenous solution, and either one, or two or more solvents typically used in conventional chemically amplified resists can be selected as appropriate.

Specific examples of the organic solvent include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenylether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents may be used singularly, or in mixed solvents of two or more different solvents. Of the solvents above, propylene glycol monomethyl ether acetate and ethyl lactate are preferred, and in terms of mixed solvents, mixed solvents of propylene glycol monomethyl ether acetate and a lactate ester are preferred. The mixture ratio is preferably from 8:2 to 2:8.

Miscible additives can also be added to the resists described above according to need, and possible additives for improving the properties of the resist film include additive resins, amines, organic carboxylic acids, oxo acids of phosphorus, ionic surfactants, dissolution inhibitors, plasticizers, stabilizers, colorants and halation prevention agents.

EXAMPLES

As follows is a more detailed description of the present invention based on a series of examples, although the present invention is in no way limited to the examples presented.

Example 1

(A1) 75 parts by mass of a polyhydroxystyrene in which 39 mol % of the hydrogen atoms of the hydroxyl groups are substituted with 1-ethoxyethyl groups, with a weight average molecular weight of 10,000 and a degree of dispersion of 1.2

(A2) 25 parts by mass of a polyhydroxystyrene in which 36 mol % of the hydrogen atoms of the hydroxyl groups are substituted with tert-butoxycarbonyl groups, with a weight average molecular weight of 10,000 and a degree of dispersion of 1.2

5 parts by mass of bis(cyclohexylsulfonyl)diazomethane 0.2 parts by mass of triethanolamine 0.05 parts by mass of a fluorosilicon based surfactant These constituents were dissolved in 490 parts by mass of propylene glycol monomethyl ether acetate, and the thus obtained solution was filtered through a membrane filter with a pore size of 0.2 μm, thereby yielding a chemically amplified positive resist composition.

Subsequently, a spinner was used to spin coat the prepared resist composition onto a 6 inch silicon wafer which had undergone hexamethyldisilazane treatment, and the composition was then dried for 90 seconds on a 90° C. hot plate, yielding a resist film with a film thickness of 1 μm. This film was then exposed, through a mask pattern, with a KrF excimer laser, using a reduction projection exposure apparatus NSR-EX8A (manufactured by Nikon Corporation, NA 0.50, σ 0.70), subsequently subjected to PEB (Post Exposure Baking) at 110° C. for 60 seconds, and then developed for 60 seconds at 23° C. in a 2.5 wt % aqueous solution of trimethylmonoethylammonium hydroxide (TEAH). The resist film was then washed in water for 30 seconds and dried to complete the formation of a resist pattern.

The resulting sensitivity was 12.0 mJ/cm$^2$.

Furthermore, the resolution was 190 nm, and the film thinning in the above process was 20 nm. In addition, the depth of focus for a 1:1 250 nm line and space resist pattern was 0.8 μm.

Example 2

With the exception of altering the constituents of the chemically amplified positive resist composition to the constituents shown below, a resist pattern was formed in the same manner as the example 1.

(A1) 75 parts by mass of a polyhydroxystyrene in which 39 mol % of the hydrogen atoms of the hydroxyl groups are substituted with 1-ethoxyethyl groups, with a weight average molecular weight of 10,000 and a degree of dispersion of 1.2

(A2) 25 parts by mass of a polyhydroxystyrene in which 36 mol % of the hydrogen atoms of the hydroxyl groups are substituted with tetrahydropyranyl groups, with a weight average molecular weight of 10,000 and a degree of dispersion of 1.2

5 parts by mass of bis(cyclohexylsulfonyl)diazomethane 0.2 parts by mass of triethanolamine 0.05 parts by mass of a fluorosilicon based surfactant The results included a sensitivity of 14 mJ/cm$^2$, a resolution of 190 nm, and film thinning of 15 nm. In addition, the depth of focus for a 1:1 220 nm line and space resist pattern was 0.6 μm.

Example 3

With the exception of altering the concentration of the TEAH solution to 2.35 wt %, a resist pattern was formed in the same manner as the example 1.

Inspection of scanning electron microscope photographs of 1:1 and 1:3 line and space resist patterns with a resist pattern width of 250 nm, revealed a high level of perpendicularity in both cases.

Comparative Examples 1 and 2

With the exception of altering the TEAH solution to a 2.38 wt % solution of TMAH in both the example 1 and the example 2, resist patterns were formed in the same manner as the example 1, and revealed the following results.

Comparative Example 1: sensitivity 11.5 mJ/cm$^2$, resolution 200 nm, and film thinning 35 nm. Furthermore, the depth of focus for a 1:1 250 nm line and space resist pattern was 0.6 μm.

Comparative Example 2: sensitivity 13 mJ/cm$^2$, resolution 200 nm, and film thinning 20 nm. Furthermore, the depth of focus for a 1:1 220 nm line and space resist pattern was 0.5 μm.

Comparative Example 3

With the exception of replacing the TEAH developer with a 2.38 wt % solution of TMAH, a resist pattern was formed in the same manner as the example 3.

Inspection of scanning electron microscope photographs of 1:1 and 1:3 line and space resist patterns with a formed resist pattern width of 250 nm revealed poor perpendicularity in both cases.

As is evident from the above description, in examples 1 to 3, superior resist patterns which displayed high sensitivity, improved resolution, reduced film thinning, a wider depth of focus, and a high level of perpendicularity were formed.

In contrast, the resist patterns obtained in the comparative examples 1 to 3 displayed lower sensitivity, lower resolution, greater film thinning, and a smaller depth of focus. The perpendicularity was also poor.

What is claimed is:

1. A resist pattern formation method, comprising:
forming a resist layer from a chemically amplified positive resist;
exposing said resist layer disposed on a substrate; and
developing said resist layer using an aqueous alkyl ammonium hydroxide solution having a concentration of ammonium hydroxide of 2.35 to 2.5 wt %, said alkyl ammonium hydroxide represented by a general formula (I) shown below:

$$R^1{}_n R^2{}_{4-n} N^+ \cdot OH^- \qquad (I)$$

wherein $R^1$ is a lower alkyl group in which a number of carbon atoms is A, $R^2$ is a lower alkyl group in which a number of carbon atoms is B, A<B, and n is an integer from 1 to 3; and
wherein said chemically amplified positive resist comprises a resin with chain type alkoxyalkyl groups as acid dissociable, dissolution inhibiting groups as a base resin, and an acid generator.

2. A resist pattern formation method according to claim 1, wherein said resist layer is a layer formed by using at least one of prebaking at 80 to 100° C., and post exposure baking at 80 to 120° C.

3. A resist pattern formation method according to claim 1, wherein said acid generator is a bis-sulfonyl diazomethane.

4. A resist pattern formation method according to claim 2, wherein said acid generator is a bis-sulfonyl diazomethane.

5. A resist pattern formation method according to claim 3, wherein said acid generator is a bis-alkylsulfonyl diazomethane.

6. A resist pattern formation method according to claim 4, wherein said acid generator is a bis-alkylsulfonyl diazomethane.

7. A resist pattern formation method according to claim 5, wherein said acid generator is bis(cyclohexylsulfonyl)diazomerthane.

8. A resist pattern formation method according to claim 6, wherein said acid generator is bis(cyclohexylsulfonyl)diazomethane.

9. A resist pattern formation method according to claim 1, wherein said alkyl ammonium hydroxide is trimethylethylammonium hydroxide.

* * * * *